United States Patent
Porowski et al.

(10) Patent No.: US 6,273,948 B1
(45) Date of Patent: Aug. 14, 2001

(54) METHOD OF FABRICATION OF HIGHLY RESISTIVE GAN BULK CRYSTALS

(75) Inventors: Sylwester Porowski; Michal Bockowski; Izabella Grzegory; Stanislaw Krukowski; Michal Leszczynski; Boleslaw Lucznik; Tadeusz Suski; Miroslaw Wroblewski, all of Warsaw (PL)

(73) Assignee: Centrum Badan Wysokocisnieniowych Polskiej Akademii Nauk, Warsaw (PL)

( * ) Notice: Subject to any disclaimer, the term of this patent is extended or adjusted under 35 U.S.C. 154(b) by 0 days.

(21) Appl. No.: 09/445,169

(22) PCT Filed: Jun. 3, 1998

(86) PCT No.: PCT/PL98/00023

§ 371 Date: Dec. 6, 1999

§ 102(e) Date: Dec. 6, 1999

(87) PCT Pub. No.: WO98/55671

PCT Pub. Date: Dec. 10, 1998

(30) Foreign Application Priority Data

Jun. 5, 1997 (PL) .......................................... 320392

(51) Int. Cl.$^7$ ........................................ C30B 9/00
(52) U.S. Cl. ........................ 117/77; 117/907; 117/952
(58) Field of Search .................................. 117/73, 77–79, 117/907, 952; 252/62.3 GA

(56) References Cited

U.S. PATENT DOCUMENTS 5,637,531 * 6/1997 Porowski et al. ...................... 117/89
6,001,748 * 12/1999 Tanaka et al. ........................ 438/791

FOREIGN PATENT DOCUMENTS

| 2313976 | 1/1977 | (FR) . |
| 1551403 | 8/1979 | (GB) . |
| 9504845 | 2/1995 | (WO) . |
| 9713891 | 4/1997 | (WO) . |

OTHER PUBLICATIONS

Patent Abstracts of Japan, vol. 98, No. 5 & JP 10 007496 A (Hitachi Cable Ltd).
Porowski et al: "Thermodynamical Properties of III–V Nitrides and Crystal Growth of Gan at High N2 Pressure" Journal of Crystal Growth., vol. 178, Jun. 2, 1997, pp. 174–188,.
Karpinski et al: "Equilibrium Pressure of N2 Over Gan and High Pressure Solution Growth of Gan" Journal of Crystal Growth., vol. 66, 1984, pp. 1–10.
Yamane et al: "Preparation of Gan Single Crystals Using A NA Flux" Chemistry of Materials, vol. 9, Feb. 1997, pp. 413–416.

* cited by examiner

*Primary Examiner*—Benjamin L. Utech
*Assistant Examiner*—Matthew Anderson
(74) *Attorney, Agent, or Firm*—Horst M. Kasper

(57) ABSTRACT

The method of fabrication of highly resistive GaN bulk crystals by crystallization from the solution of atomic nitrogen in the molten mixture of metals, containing gallium in the concentration not lower than 90 at. % and the Periodic Table group II metals: calcium, beryllium or in the concentration of 0.01–10 at. %, at the temperature 1300–1700° C., under the nitrogen pressure 0.5–2.0 GPa and in the presence of temperature gradient characterized by the temperature gradient not higher than 10° C./cm.

10 Claims, No Drawings

METHOD OF FABRICATION OF HIGHLY RESISTIVE GAN BULK CRYSTALS

This is a National Stage Application of PCT/PL 98/0023 which was filed Jun. 3, 1998.

FIELD OF THE INVENTION

This Invention relates to the method of fabrication of highly resistive GaN bulk crystals for manufacturing of optoelectronic devices.

BACKGROUND OF THE INVENTION

According to the present state of the art of growth of single crystals there are not known methods of manufacturing of highly resistive GaN bulk crystals.

OBJECT AND SUMMARY OF THE INVENTION

According to the Invention, GaN crystallization is effected in the solution of atomic nitrogen in molten mixture of the metals containing gallium in the concentration not lower than 90 at % and at least one of Periodic Table group II metals: Mg, Ca, Be, Zn, Cd in the concentration: 0.01–10 at % in order to reduce the concentration of free electron carriers in the crystal by change of microscopic growth mechanism leading to the improvement of the stoichiometry and compensation on nonintentionally introduced donor impurities. The process is conducted under nitrogen pressure 0.5–2.0 GPa and in the temperature 1300–1700° C. in order to assure the stability of GaN and high concentration of nitrogen in liquid solution. Crystallization in conducted the temperature gradient not smaller than 10° C./cm, which assures low supersaturation in the growth zone, necessary to obtain GaN crystal growth velocity lower than 0.2 mm/h, necessary for stable growth of large size crystals.

In the results of the growth process hexagonal GaN plate-like crystals are obtained, having the specific resistivity $10^4$–$10^8$ $\Omega$cm, characterized by high structural quality and the lattice parameters close to the perfect crystal. These so obtained crystals, are not available at present, and can be used as perfect substrates for unstrained homoepitaxial GaN layers.

The subject of the Invention is demonstrated on the examples of applications.

EXAMPLE 1

The molten mixture of semiconductor purity metals consisting of 99.5 at. % of gallium and 0.5 at. % of magnesium is poured into the vertically configured graphite crucible under the shield of inert gas. The crucible is located into the three-zone graphite furnace which is turn is positioned inside the high pressure vessel, which in the first stage is evacuated to the vacuum level of $10^{-5}$ Torr. The system is annealed in the vacuum in the temperature 800° C. during 12 hours. After the annealing, the vessel is filled with nitrogen of 6N purity achieving the initial pressure of 10–15 MPa. Then the gas is compressed to the pressure of 1.5 GPa and after the compression, the crucible is heated to the temperature of 1550° C. in such a way that the temperature along the crucible axis is kept constant. Then the temperature of the lower end of the crucible is lowered by 30° C. obtaining the temperature gradient along the axis of the crucible. These conditions of the process are preserved during the period of 120 hours. After 120 of crystallization, the system is cooled down with the rate of 5° C./min to the room temperature and after that the nitrogen pressure is lowered to the atmospheric pressure. After the extraction of the crucible from the high pressure vessel, the crucible is warmed up to the temperature 50° C. and the molten metal is poured out from the crucible. At the bottom of the crucible there are GaN crystals in the form of hexagonal platelets of the size of 6–8 mm. The GaN crystals are extracted from the crucible and etched in aqua regia in order to remove the remaining part of the metal.

GaN crystals, obtained in this process characterize by the specific resistivity equal to $10^6$ $\Omega$cm and high structural quality. The halfwidth of (0004) reflection of x-ray $\alpha$CuK line is 20–30 arc sec, and the a and c lattice parameters are very uniform and are equal to: 3.1877 Å and 5.1848 Å, respectively.

We claim:

1. A method for fabrication of highly resistive GaN bulk crystals comprising melting a mixture of semiconductor purity metals, containing gallium in the concentration not lower than 90 atomic percent and a metal selected from the group consisting of beryllium, calcium and mixtures thereof in a weight amount of from about 0.01–10 atomic percent;

subjecting the molten mixture of metals to a nitrogen pressure of from about 0.5 to 2.00 GPa; and crystallizing gallium nitride from this molten metal mixture under nitrogen pressure.

2. The method of fabrication of highly resistive GaN bulk crystals according to claim 1, wherein the Periodic Table of the Chemical Elements group II metal is a metal selected from the group consisting of calcium, beryllium and mixtures thereof.

3. The method of fabrication of highly resistive GaN bulk crystals according to claim 1, wherein the molten mixture of metals contains atomic nitrogen.

4. The method of fabrication of highly resistive GaN bulk crystals according to claim 1, further comprising establishing a temperature gradient in the molten mixture of metals.

5. The method of fabrication of highly resistive GaN bulk crystals according to claim 4, wherein the temperature gradient is not more than 10° centigrade per millimeter and wherein the melt is at a temperature of from about 1300 to 1700 degrees centigrade.

6. The method of fabrication of highly resistive GaN bulk crystals according to claim 1, wherein the crystallization temperature is from about 1300 to 1700 degrees centigrade.

7. The method of fabrication of highly resistive GaN bulk crystals according to claim 1, wherein the temperature gradient in the molten mixture of metals is not higher than 10 degrees centigrade per centimeter.

8. The method of fabrication of highly resistive GaN bulk crystals, characterized by crystallization from the solution of atomic nitrogen in the molten mixture of semiconductor purity metals, containing gallium in the concentration not lower than 90 at % and a metal selected from the group consisting of calcium, beryllium, and mixtures thereof in a concentration of 0.01–10 at % under a nitrogen pressure 0.5–2.00 GPa.

9. The method of fabrication of highly resistive GaN bulk crystals according to claim 8, characterized by the crystallization temperature 1300–1700° C.

10. The method of fabrication of highly resistive GaN bulk crystals, according to claim 8, characterized by the temperature gradient not higher than 10° C./cm.

* * * * *